United States Patent [19]
Sakuyama

[11] Patent Number: 6,018,462
[45] Date of Patent: Jan. 25, 2000

[54] MULTI-TIP MODULE

[75] Inventor: Tomohiro Sakuyama, Tokyo, Japan

[73] Assignee: NEC Corporation, Tokyo, Japan

[21] Appl. No.: 09/104,824

[22] Filed: Jun. 25, 1998

[30] Foreign Application Priority Data

Jun. 30, 1997 [JP] Japan ................................. 9-173658

[51] Int. Cl.⁷ ............................ H05K 1/11; H05K 1/14; H01L 23/12
[52] U.S. Cl. ...................... 361/777; 361/774; 257/738; 257/780
[58] Field of Search .................................. 174/260, 261, 174/267; 228/180.21, 180.22; 257/665, 690, 692, 723, 724, 737, 738, 772, 778, 773, 774, 779, 780, 786; 361/760, 767, 768, 771, 772, 773, 774, 777, 779, 782, 783; 439/68, 63; 438/108, 612, 613

[56] References Cited

FOREIGN PATENT DOCUMENTS

| | | | |
|---|---|---|---|
| 63-245952 | 10/1988 | Japan | H01L 23/52 |
| 5341014 | 12/1993 | Japan | G01R 31/28 |
| 6331705 | 12/1994 | Japan | G01R 31/28 |
| 7-168781 | 7/1995 | Japan . | |
| 8-31977 | 2/1996 | Japan . | |
| 8-264677 | 10/1996 | Japan . | |
| 9152449 | 6/1997 | Japan | G01R 1/06 |
| 9-330993 | 12/1997 | Japan . | |
| 10-335517 | 12/1998 | Japan . | |

*Primary Examiner*—Donald Sparks
*Attorney, Agent, or Firm*—Hayes Soloway Hennessey Grossman & Hage PC

[57] ABSTRACT

An electrical pad for installation to a board, formed on the module substrate on which a plurality of tips is mounted, are divided into a plurality of divisional pads. Furthermore, each of the divisional pads are connected to each electrode terminals of those tips, and when installed, divisional pads of a pad are electrically connected to be united into a pad.

8 Claims, 8 Drawing Sheets

1 : MODULE SUBSTRATE
3 : MOUNTING PADS
4 : ELECTRODE PADS
5 : THROUGH-HOLES
6a ~ 6c : BARE TIPS
8 : METTALIC BUMP
9 : METALLIC BUMP

1 : MODULE SUBSTRATE
4 : ELECTRODE PADS
4a ~ 4d : DIVISIONAL PADS
5a ~ 5d : THROUGH-HOLES

FIG. 2

1 : MODULE SUBSTRATE
4 : ELECTRODE PADS
4a ~ 4d : DIVISIONAL PADS
5a ~ 5d : THROUGH-HOLES

FIG. 3

1 : ELECTRODE PADS
4a ~ 4d : DIVISIONAL PADS
7 : ELECTRODE TERMINALS

FIG. 4

1 : MODULE SUBSTRATE
4 : DIVISIONAL PADS
4a ~ 4d : DIVISIONAL PADS
9 : METALLIC BUMP

4 : ELECTRODE PADS

1 : MODULE SUBSTRATE
4A : ELECTRODE PADS
4Aa ~ 4Ac : DIVISIONLA PADS
10 : WIRE

FIG. 7

6a ~ 6d : BARE TIPS
4 : ELECTRODE PADS

FIG. 8

4 : ELECTRODE PADS
4X : TESTING PADS

MULTI-TIP MODULE

BACKGROUND OF THE INVENTION

1. Field of the Invention

The present invention relates to a multi-tip module mounting a plurality of bare tips, and more particularly relates to a multi-tip module which has improved electrode pads of the module substrate.

This application is based on Patent Application No. Hei 9-173658 filed in Japan, the content of which is incorporated herein by reference.

2. Background Art

In a multiple-tip-module on which a plurality of bare tips are mounted, when the test is carried out for each bare tip by means of a testing device such as a LSI tester, it is necessary to electrically connect the testing device to each electrode terminal of bare tips.

Figure 7:
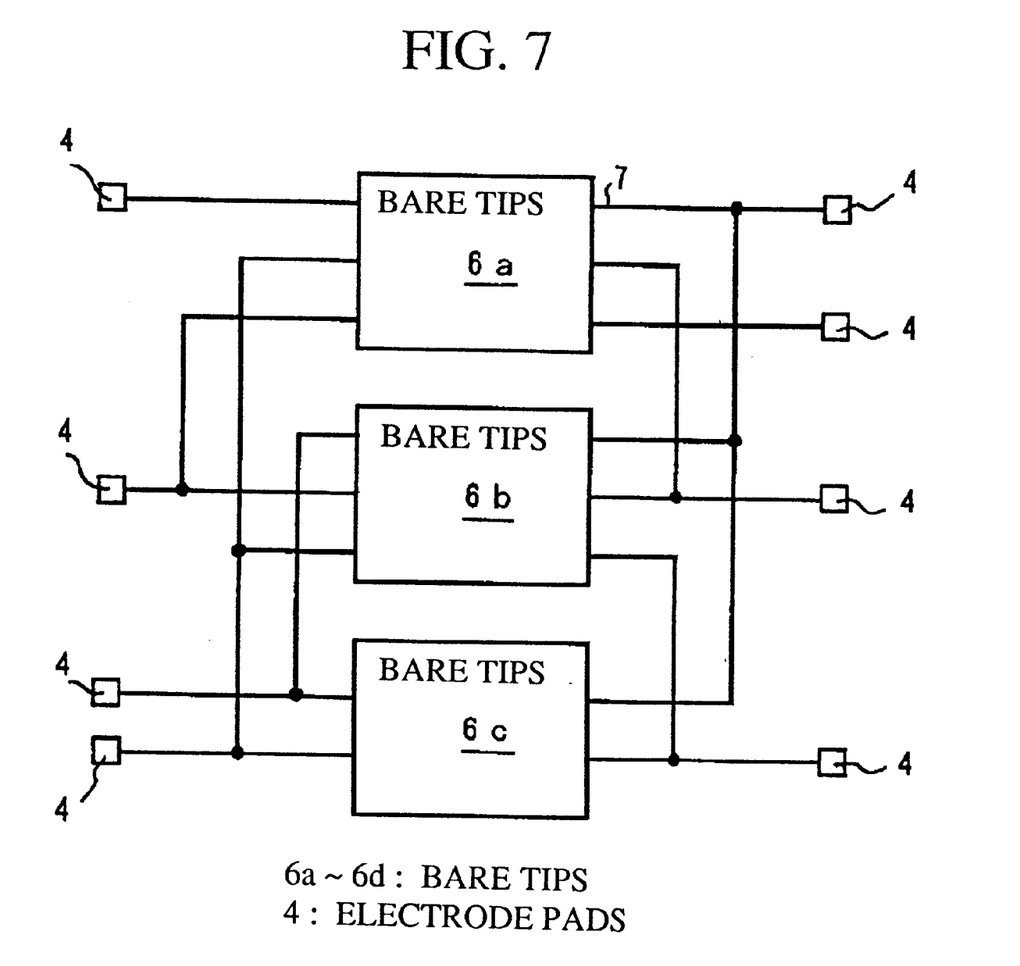
FIG. 7 shows a circuit of a multi-tip module which is to be realized by the present invention.

Assume, for example, as shown in FIG. 7, that a multi-tip module is provided with a circuit formed by three bare tips 6a to 6c and eight electrode pads 4 in total. In this case, if it is possible to connect the testing device to each electrode terminal 7 of the bare tips 6a to 6c loaded on the module substrate, the bare tips 7 are capable of being tested as loaded on the module substrate.

Figure 8:
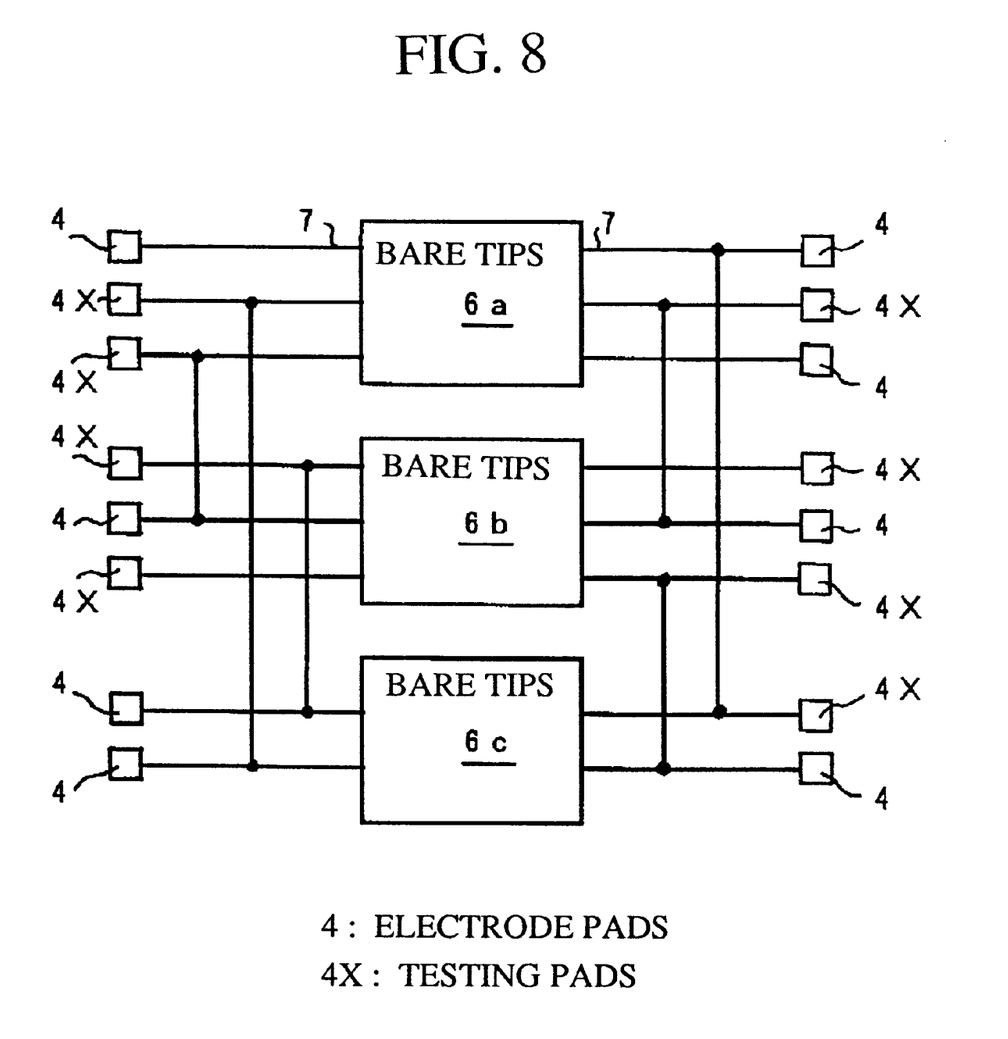
FIG. 8 is a circuit diagram showing an example of the conventional multi-tip module.

However, if the bare tips 6a to 6c are mounted on the module substrate by a flip-tip method and consequently, the electrode terminals are not exposed, the testing device cannot be connected to the electrode terminals of bare tips 6a to 6c. Thus, it becomes necessary to form electrode pads for testing which are connected to each electrode terminal. Particularly, in a multi-tip module shown in FIG. 7. where a part of the circuit is formed in a closed state, it is necessary to form test pads for connecting the test device independently to electrode terminals in the closed-circuit portion. Conventionally, as shown in FIG. 8, a measure was usually taken by providing 16 pads in total, which include 8 pads 4 for connecting at the time of installing the module on the circuit board and 8 pads 4X connecting to the testing device.

However, in a multi-tip module provided with pads for testing, it is necessary to prepare spaces on the module substrate for arranging the testing pads in addition to the installation pads which are originally necessary. Consequently, it becomes difficult to reduce the size of the module, and thereby, realize small-sized multi-tip modules. In contrast, when the size of the module is limited, each pad must be formed in a small restricted area. Especially when a metallic bump structure is adopted and if each pad is formed in a small restricted area, it becomes difficult to form a bump with appropriate dimensions; therefore, it is difficult to preferably install multi-tip modules on a circuit board.

It is, therefore, a object of the present invention to provide a multi-tip module, which is capable of testing bare tips as mounted on the module and which is provided with the installation pads with not restricted and sufficient surface area.

SUMMARY OF THE INVENTION

The present invention provides a multi-tip module comprising a plurality of tips mounted on a substrate and electrode pads for installation on a circuit board so as to be electrically connected with a circuit constituted by the tips, wherein each pad is divided into a plurality of divisional pads, each divisional pad being individually connected to respective electrode terminals, and the divisional pads being mutually electrically connected to form one pad before installation. Furthermore, each divisional pad is formed so as to be connectable with the testing device and to be capable of implementing inspection of electrical properties of tips through electrically connected divisional pads. In particular, electrode terminals of each tip which are involved in the part of the closed circuit are electrically connected to each of the divisional pads.

DETAILED DESCRIPTION OF THE PREFERRED EMBODIMENTS

Preferred embodiments of the present invention are described hereinafter referring to the drawings.

Figure 1:
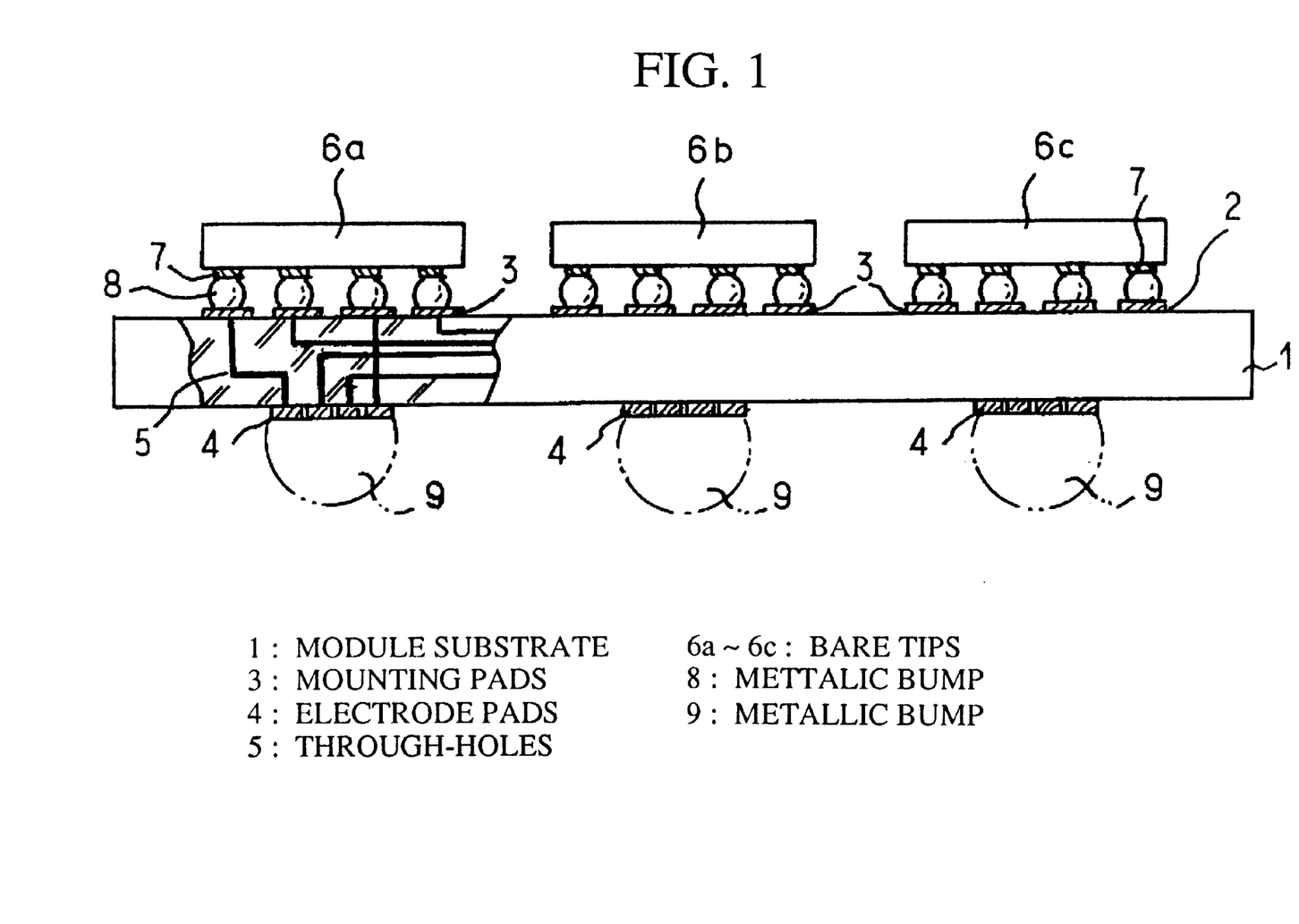
FIG. 1 is a cross-sectional side view of a part of the multi-tip module according an embodiment of the present invention.

FIG. 1 show a cross sectional side view of an embodiment of the present invention, wherein the present invention is applied to a ball-grid-array type multi-tip module; thereby, the circuit formation illustrated in FIG. 7 is realized. On a module substrate 1 formed by an insulating plate, wirings 2 connects the mounting pads 4 which is provided to mount a plurality of (in this embodiment three) bare tips. On the rear surface of the substrate 1, electrode pads 4 are formed by a conductive film and the electrode pads 4 are connected to the mounting pads 3 or the wiring 2 by through-holes 5 formed in the direction of the thickness of the substrate 1. Three bare tips 6a to 6c are installed on the front surface of the module substrate 1, and electrical connections are formed by the flip-tip method using of metallic pumps 8 which are formed at electrical terminals 7 of each bare tips 6a to 6c.

Figure 2:
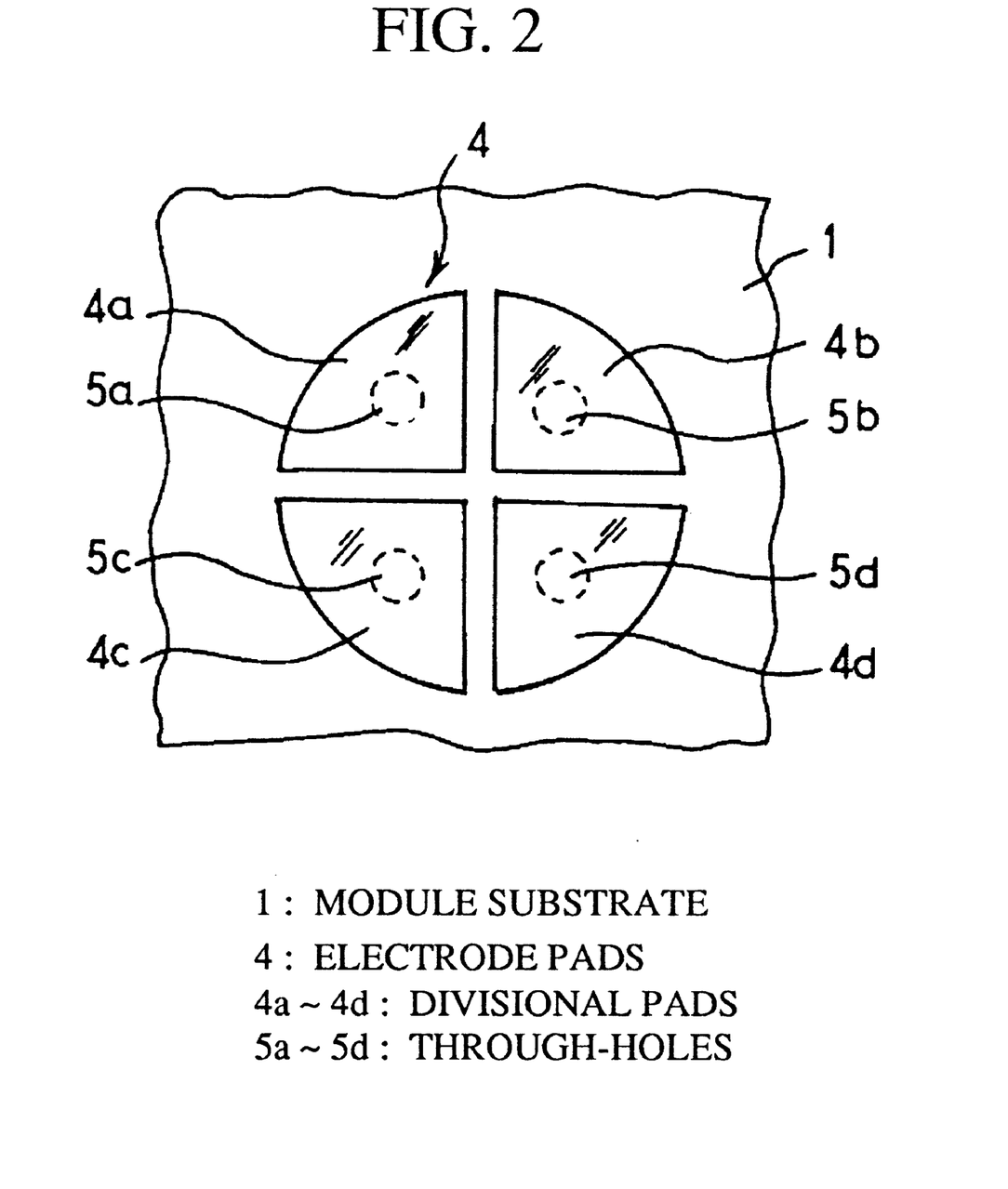
FIG. 2 is a plan view of an electrode pad.
Figure 3:
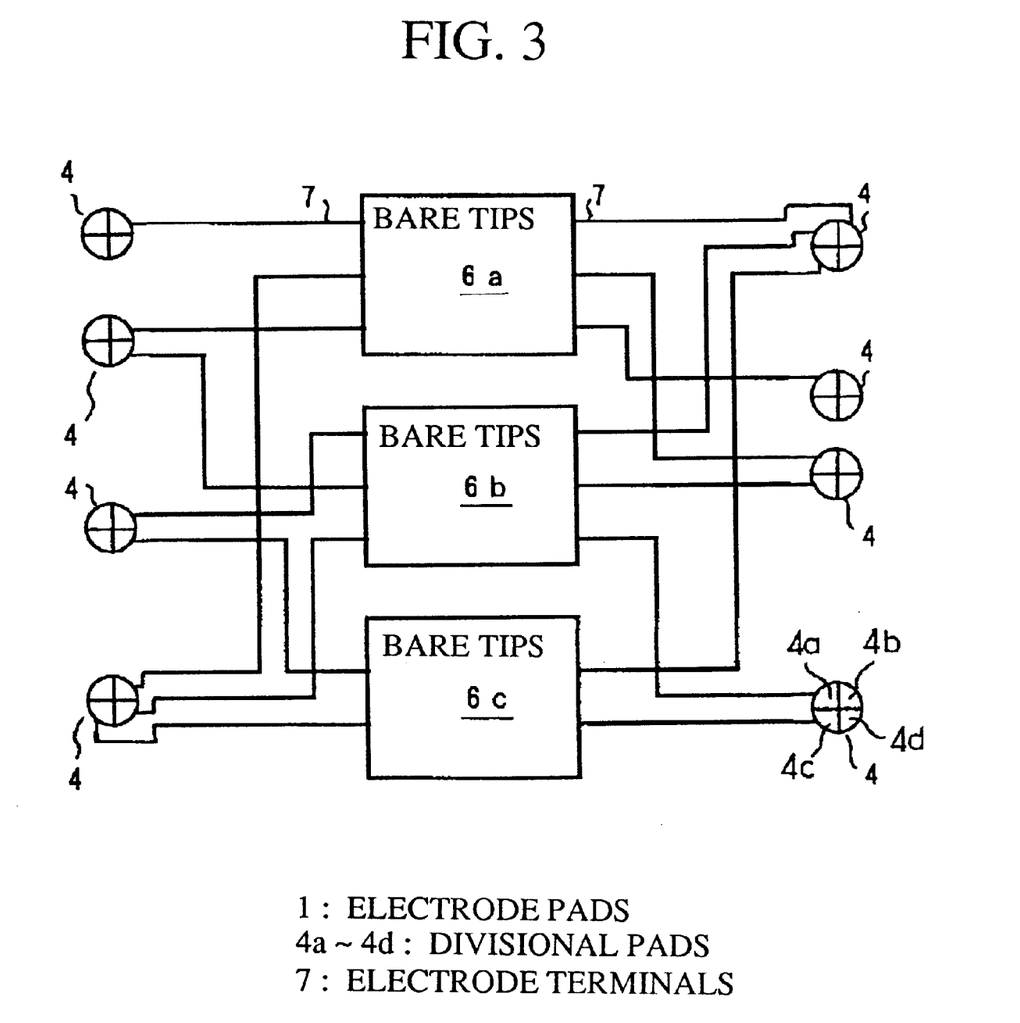
FIG. 3 shows circuit connection between bare tips and the electrode pads.
Figure 4:
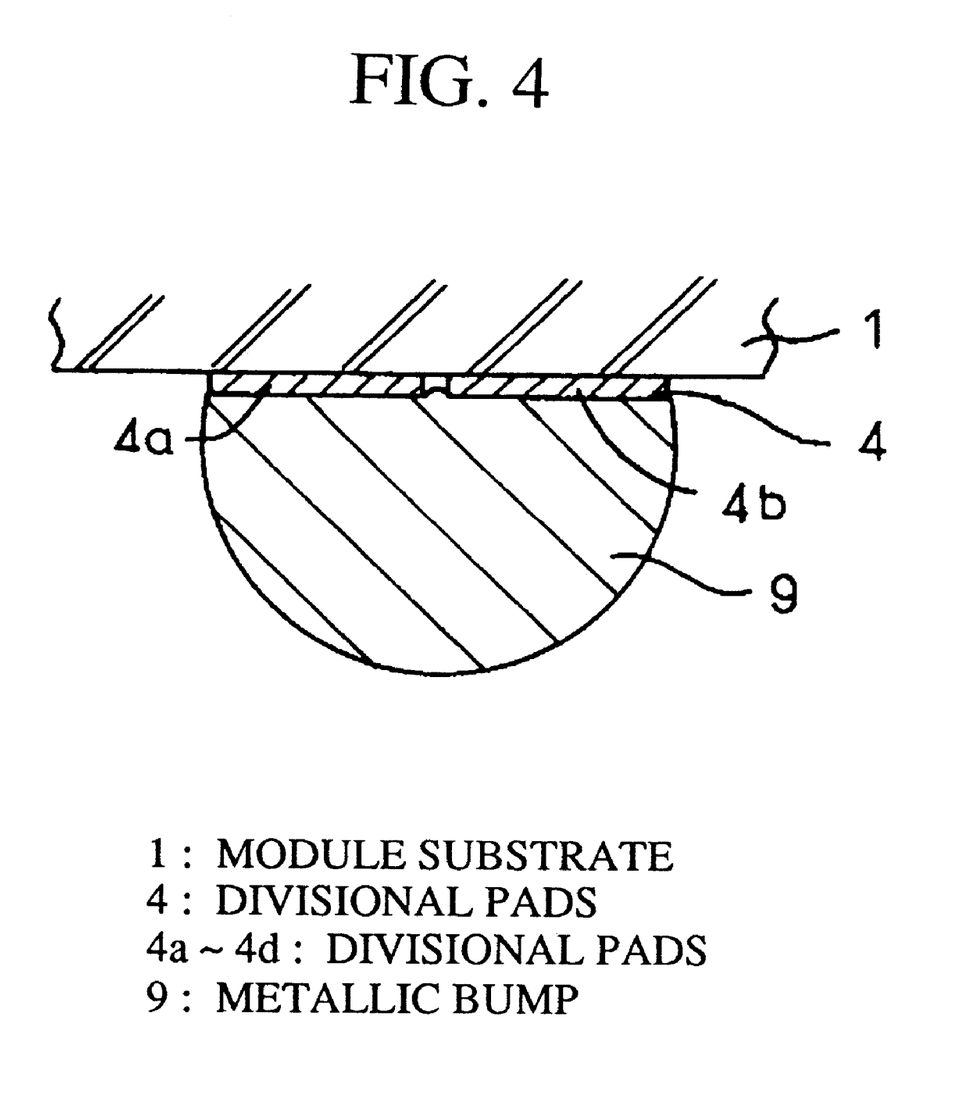
FIG. 4 is cross-sectional view of a metallic bump.

FIG. 2 illustrates an enlarged plan view of each electrode pad 4. Although each electrode pad 4 is formed as a circular pad, the circular pad is divided into four divisional pads 4a to 4d by a cross-shaped groove and each divisional pad is electrically insulated from the others. For each divisional pad, the above mounting pads 3 or wirings 2 are individually connected through the through holes 5a to 5d. Consequently, three bare tips 6a to 6c placed on the above electrode pads 4 are wired to form a circuit structure as shown in FIG. 3. In this case, electrode terminals 7, which are connected to each other for connecting each of the bare tips 6a to 6c, as shown in FIG. 7, are connected to divisional pads 4a to 4d of an identical electrode pad 4.

Therefore, in this multi-tip module, electrode terminals 7 of each of the bare tips 6a to 6c are connected in one-to-one correspondence to respective divisional pads 4a to 4d of the electrode pad 4 arranged at the rear surface of the module substrate 1. Thus, in a state that the bare tips 6a to 6c are as mounted on the module substrate 1, and even if electrode terminals 7 are concealed by the bare-tip itself, the testing device can be connected to the divisional pads 4a to 4d which are located at the rear surface and correspond to each of the electrode pads 4; thereby, each bare tip can be tested through divisional pads 4a to 4d.

After the individual bare tips are tested, the multi-tip module is formed by forming metallic bumps 9 on each pad area including divisional pads 4a to 4d, as shown in FIG. 1 by dotted lines, such that respective divisional pads are electrically connected and, as a result, the same circuit is formed as that shown in FIG. 7. Accordingly, it becomes possible to install the thus formed multi-tip module on an installation-board (not shown) by the use of bumps 9. In this installation structure, since the bump 9 is formed on the whole surface area of the electrode pad 4, it is possible to form large diameter bumps, which facilitates productive installation operation. It is not necessary to form metallic pumps 9 on every electrode pad except those necessary for the installation operation. Therefore, the bumps 9 do not unnecessarily occupy the substrate surface area and the reduction of the size of the multi-tip module can be realized.

Figure 5A:
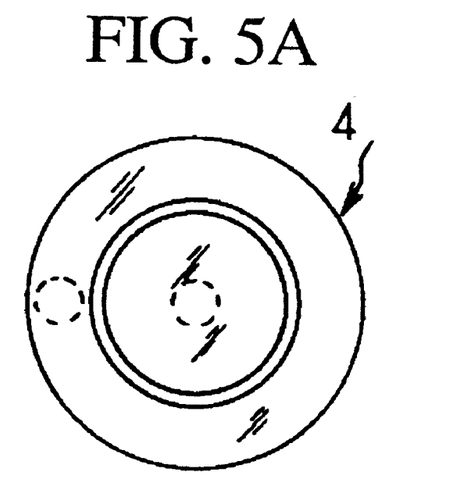
FIG. 5A and 5B shows other examples of the electrode pad.
Figure 5B:
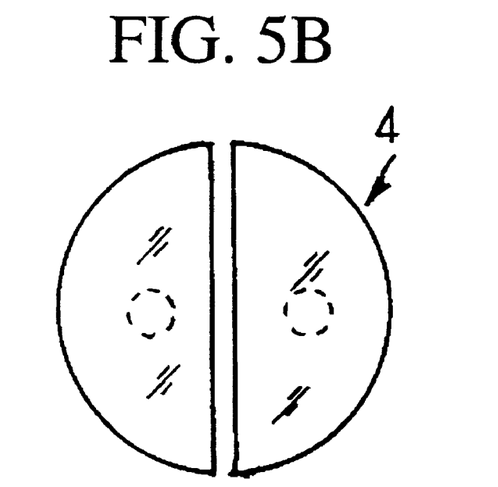
Figure 6A:
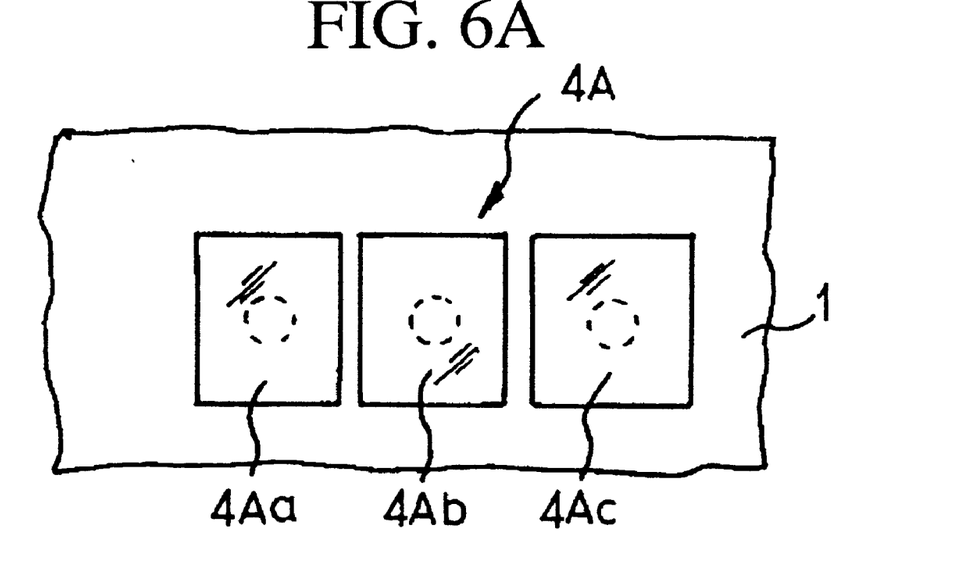
FIG. 6A and 6B is a plan view and a cross-sectional view of the other example of the electrode pad.
Figure 6B:
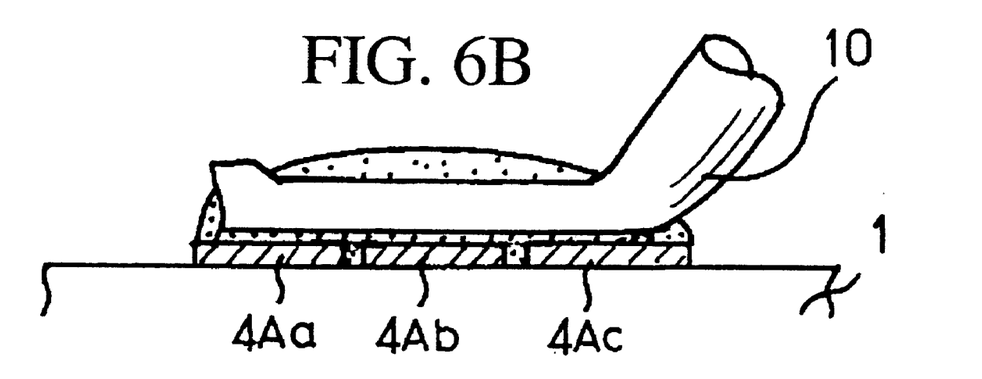

In the above embodiment, an example is shown where the divisional pads are formed by dividing an electrode pad into four parts. However, it may be possible to adopt other examples dividing the pad into two concentric pieces as shown in FIG. 5A or dividing into two pieces along a rectilinear diameter as shown in FIG. 5B. Furthermore, it is possible to divide into any optional shapes to meet a necessary number of divisional pads. For pads which are designed to connect only by wiring without forming metallic bump, it is possible to divide a rectangular electrode pad into a plurality of divisional pads as shown in FIG. 6A along its longitudinal direction and to electrically connect divisional pads by first laying a connecting wire 10 on the divisional pads 4Aa to 4Ac and then by soldering, as shown in FIG. 6B.

As hereinbefore described, electrode pads for practical installation formed on the module substrate on which a plurality of tips are loaded, are divided into a plurality of divisional pads. Furthermore, these divisional pads are individually connected to electrode terminals of the mounted tips and, when installed on the board, these divisional pads are connected to each other to be one electrode pad, so that even when the tips are mounted on the module substrate by a flip-tip method, it is possible to test an individual tip by use of divisional pads. In contrast, when the multi-tip module is installed on a circuit board, a plurality of divisional pads can be united into one pad, so that the areas occupied by the pads are reduced, which enables reducing the size of multi-tip module.

What is claimed is:

1. A multi-tip module comprising a plurality of tips on the substrate, and electrode pads for practical installation formed on said substrate and for being connected with a circuit constituted by said tips, wherein, said electrode pads are divided into a plurality of divisional pads, said divisional pads are respectively connected to the electrode terminals of said tips, and said divisional pads are electrically connected to be united into one electrode pad, when said module is practically installed on an installation board.

2. A multi-tip module according to claim 1, wherein said divisional pads are provided to be electrically connectable with a testing device such that electrical characteristics of said tips are tested through said divisional pads connected to said testing device.

3. A multi-tip module according to claim 1, wherein electrode terminals of said tips which are connected in a closed state in the multi-module tip are electrically connected to each of said divisional pads formed as one electrode pad.

4. A multi-tip module according to claim 3, wherein a metallic bump is formed on the area of said one electrode pad including divisional pads, and each of said divisional pads are connected to each other by said metallic pump.

5. A multi-tip module according to claim 3, wherein a wire is connected on a whole area of one electrode pad including a plurality of divisional pads, and said divisional pads are electrically connected to each other.

6. A multi-tip module according to claim 2, wherein electrode terminals of said tips which are connected in a close state in the multi-module tip are electrically connected to each of said divisional pads formed as one electrode pad.

7. A multi-tip module according to claim 6, wherein a metallic bump is fonned on the area of said one electrode pad including divisional pads, and each of said divisional pads are connected to each other by said metallic pump.

8. A multi-tip module according to claim 6, wherein a wire is connected on a whole area of one electrode pad including a plurality of divisional pads, and said divisional pads are electrically connected to each other.

* * * * *

UNITED STATES PATENT AND TRADEMARK OFFICE
CERTIFICATE OF CORRECTION

PATENT NO. : 6,018,462
DATED : January 25, 2000
INVENTOR(S) : Sakuyama

It is certified that error appears in the above-identified patent and that said Letters Patent are hereby corrected as shown below:

Col. 4, Line 38, "fonned" should be - -formed- -.

Signed and Sealed this

Third Day of April, 2001

*Attest:*

NICHOLAS P. GODICI

*Attesting Officer*  *Acting Director of the United States Patent and Trademark Office*